United States Patent
Mori et al.

(10) Patent No.: US 9,312,155 B2
(45) Date of Patent: Apr. 12, 2016

(54) HIGH-THROUGHPUT SEMICONDUCTOR-PROCESSING APPARATUS EQUIPPED WITH MULTIPLE DUAL-CHAMBER MODULES

(75) Inventors: Yukihiro Mori, Machida (JP); Takayuki Yamagishi, Kashiwazaki (JP)

(73) Assignee: ASM Japan K.K., Tokyo (JP)

( * ) Notice: Subject to any disclaimer, the term of this patent is extended or adjusted under 35 U.S.C. 154(b) by 1029 days.

(21) Appl. No.: 13/154,271

(22) Filed: Jun. 6, 2011

(65) Prior Publication Data
US 2012/0305196 A1 Dec. 6, 2012

(51) Int. Cl.
| | |
|---|---|
| B05C 11/10 | (2006.01) |
| B32B 41/00 | (2006.01) |
| H01L 21/683 | (2006.01) |
| H01L 21/67 | (2006.01) |
| G05B 19/418 | (2006.01) |
| H01L 21/677 | (2006.01) |

(52) U.S. Cl.
CPC ...... *H01L 21/6719* (2013.01); *G05B 19/41865* (2013.01); *H01L 21/67167* (2013.01); *H01L 21/67742* (2013.01); *G05B 2219/32265* (2013.01); *G05B 2219/45031* (2013.01)

(58) Field of Classification Search
CPC ............. H01L 21/6719; H01L 21/67167; G05B 19/41865; G05B 2219/45031
USPC ................................ 118/719; 156/345.32
See application file for complete search history.

(56) References Cited

U.S. PATENT DOCUMENTS

| | | | |
|---|---|---|---|
| 6,074,443 A | 6/2000 | Venkatesh | |
| 6,315,512 B1 * | 11/2001 | Tabrizi et al. | 414/217 |
| 7,618,226 B2 | 11/2009 | Takizawa | |
| 7,690,881 B2 | 4/2010 | Yamagishi | |
| 8,060,252 B2 * | 11/2011 | Gage et al. | 700/248 |
| 2005/0051093 A1 * | 3/2005 | Makino et al. | 118/719 |
| 2007/0098527 A1 * | 5/2007 | Hall et al. | 414/222.01 |
| 2008/0152463 A1 * | 6/2008 | Chidambaram et al. | 414/217 |
| 2010/0068009 A1 * | 3/2010 | Kimura | H01L 21/67778 414/217.1 |

* cited by examiner

*Primary Examiner* — Parviz Hassanzadeh
*Assistant Examiner* — Nathan K Ford
(74) *Attorney, Agent, or Firm* — Snell & Wilmer LLP (57) ABSTRACT

A wafer-processing apparatus includes: eight or ten reactors with identical capacity for processing wafers on the same plane, constituting four or five discrete units, each unit having two reactors arranged side by side with their fronts aligned in a line; a wafer-handling chamber including two wafer-handling robot arms each having at least two end-effectors; a load lock chamber; and a sequencer for performing, using the two wafer-handling robot arms, steps of unloading/loading processed/unprocessed wafers from/to any one of the units, and steps of unloading/loading processed/unprocessed wafers from/to all the other respective units in sequence while the wafers are in the one of the units.

10 Claims, 9 Drawing Sheets

HIGH-THROUGHPUT SEMICONDUCTOR-PROCESSING APPARATUS EQUIPPED WITH MULTIPLE DUAL-CHAMBER MODULES

BACKGROUND OF THE INVENTION

1. Field of the Invention

The present invention generally relates to a high-throughput semiconductor-processing apparatus equipped with multiple dual-chamber modules.

2. Description of the Related Art

Figure 10:
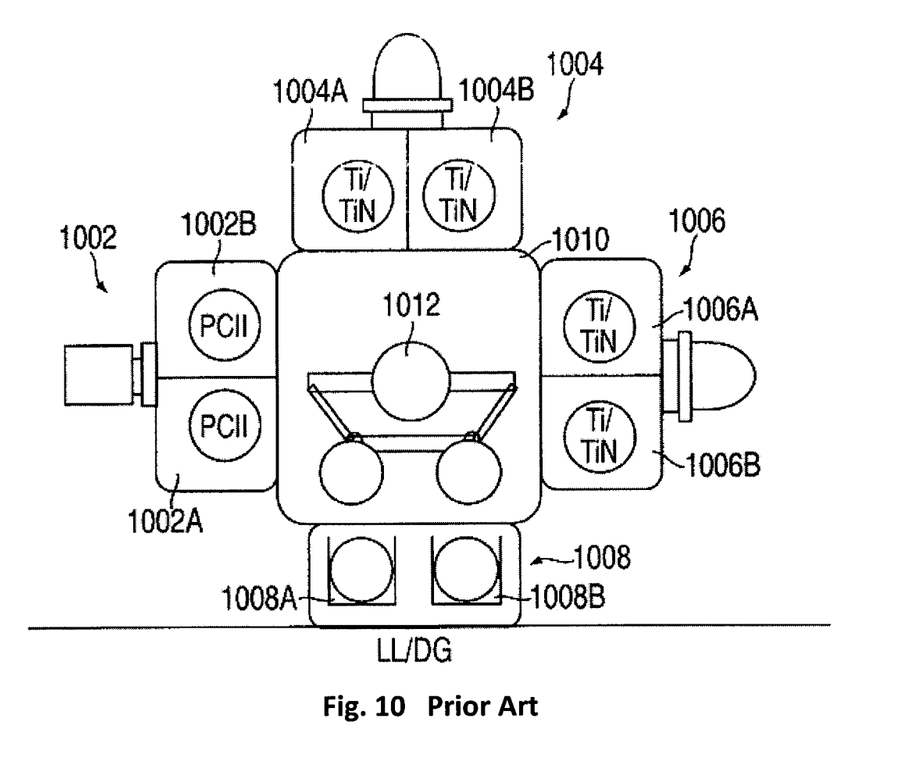
FIG. 10 is a schematic view of a conventional plasma CVD apparatus.

In the field of CVD apparatuses and etcher apparatuses for treating substrates such as semiconductor wafers, improvement on the productivity or throughput is one important factor. For example, U.S. Pat. No. 6,074,443 teaches a total of four reaction chambers. As shown in FIG. 10, the equipment consists of a preclean chamber 1002 and reaction chambers 1004, 1006 attached to a central chamber 1010 with a transport mechanism 1012, and each processing chamber contains sub-chambers 1002A and B, 1004A and B, and 1006A and B, respectively (the total of reaction sub-chambers is four). Wafers are transferred to wafer cassettes 1008A and B within a load lock 1008. In the apparatus, processing time can be shortened, and productivity can be improved.

However, although wafer-handling time (required for unloading/loading a pair of wafers from/to a reaction chamber and moving onto a next reaction chamber) has been getting shorter, due to operational limits of servomotors, friction between wafers (silicon, glass, etc.) and handling materials (ceramics, metal, etc.) for supporting wafers, etc., the wafer-handling time is getting close to its limit, e.g., about 20 seconds when transferring a pair of wafers simultaneously. As described above, although the wafer-handling time is shortened, process time is not significantly shortened. For example, it generally takes about 60 to about 80 seconds for thin film processing associated with downsizing of devices and tendency of finer structures (e.g., in general, a thickness of about 50 nm to about 350 nm by standard plasma CVD). Thus, conventionally, the wafer-handling robot is not fully and continuously in operation and waits for the reaction chambers to complete processing. Although the apparatus shown in FIG. 10 has three sides for attaching chambers thereto, one chamber thereof is for precleaning, and thus, effectively, only two sides (four sub-chambers) are used for deposition. Thus, in the conventional apparatus, the wafer-handling robot is not fully and continuously in operation and waits for the sub-chambers to complete processing. Further, because a sub-chamber for precleaning is used, it is difficult to simplify, regulate, and speed up transferring wafers by the wafer-handling robot. Even if the sub-chambers for precleaning are used as those for deposition, three sides (six sub-chambers) are used at maximum.

Figure 5:
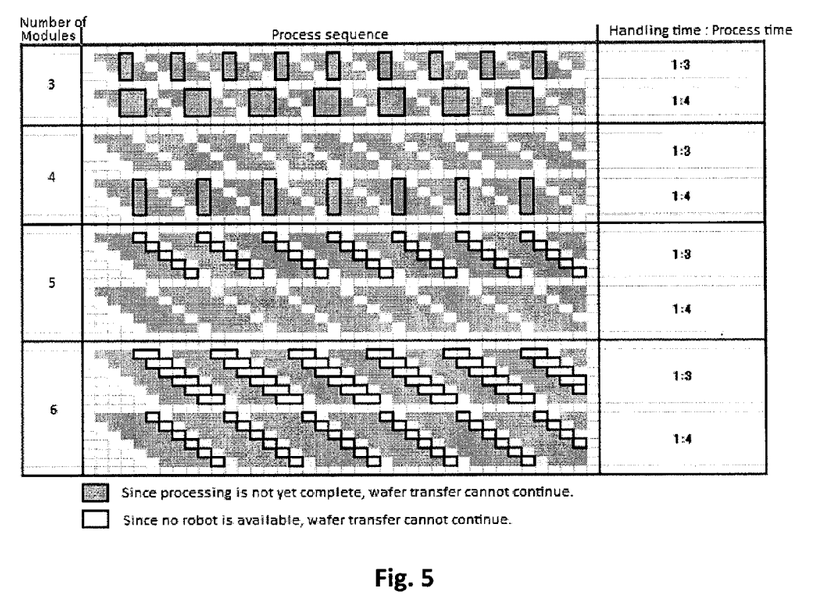
FIG. 5 is a timing chart showing the timing of unloading/loading wafers and the timing of processing wafers in a comparative apparatus having 3 dual-chamber modules, and apparatuses having 4, 5, or 6 dual-chamber modules according to embodiments of the present invention.

The sequence when three sides are used is illustrated in FIG. 5. When three modules (three sides) are connected to a wafer-handling chamber, if the ratio of handling time to process time is either about ⅓ or about ¼, there is dead time, i.e., a back end robot waits for the first/second module to finish processing wafers, although the back end robot finishes unloading/loading wafers from/to the third module and is ready to unload the processed wafers from the first/second module. Further, practical maintenance of the modules and the wafer-handling chamber and sequences of deposition rotation need to be considered.

Except FIG. 10 itself, any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

An embodiment of the present invention provides a wafer-processing apparatus, comprising: (i) eight or ten reactors with identical capacity for processing wafers on the same plane, constituting four or five discrete units, each unit having two reactors arranged (e.g., side by side) with their fronts aligned in a line; (ii) a wafer-handling chamber including two wafer-handling robot arms (e.g., a wafer-handling robot constituted by two arms), each having at least two end-effectors accessible to the two reactors of each unit simultaneously, said wafer-handling chamber having a polygonal shape having four or five sides corresponding to and being attached to the four or five discrete units, respectively, and one additional side for a load lock chamber, all the sides being disposed on the same plane; (iii) a load lock chamber for loading or unloading two wafers simultaneously, said load lock chamber being attached to the one additional side of the wafer-handling chamber, wherein each wafer-handling robot arm is accessible to the load lock chamber; and (iv) a sequencer for performing, using the two wafer-handling robot arms, steps of unloading/loading processed/unprocessed wafers from/to any one of the units, and steps of unloading/loading processed/unprocessed wafers from/to all the other respective units in sequence while the wafers are in the one of the units.

In some embodiments, in the wafer-handling chamber with the four or five discrete units, an imaginary isosceles triangle is formed as viewed from above using sides of the adjacent units as the two equal sides of the isosceles triangle, wherein the length of the bottom of the isosceles triangle is equal to or greater than the length of the two equal sides of the isosceles triangle.

In some embodiments, the sequencer performs the steps of unloading/loading processed/unprocessed wafers from/to the all other respective units while processing the wafers in the one of the units.

In some embodiments, the wafer-processing apparatus further comprises: (v) four or five discrete gas boxes for controlling gases corresponding to and being connected to the four or five discrete units, respectively, said four or five discrete gas boxes being disposed under the corresponding four or five discrete units; and (vi) four or five discrete electric boxes for controlling electric systems corresponding to and being detachably connected to the four or five discrete units, respectively, said four or five discrete electric boxes being disposed under the corresponding four or five discrete units and next to the corresponding four or five discrete gas boxes, wherein the gas boxes and the electric boxes are arranged alternately as viewed from above, and the electric boxes can be pulled out outwardly without being disconnected from the corresponding units so that three sides of the gas boxes are accessible.

In some embodiments, the polygonal shape is a pentagon (e.g., regular pentagon) or hexagon (e.g., regular hexagon). In some embodiments, the electric boxes have casters at their bottoms. In some embodiments, the gas boxes and the electric boxes have an approximately trapezoidal shape having an inner face and an outer face as viewed from above wherein the inner face is shorter than the outer face as viewed from above. In some embodiments, side faces of the gas boxes and side faces of the electric boxes are closely disposed or are in contact with each other.

In some embodiments, each wafer-handling robot arm is a multi-axis robot arm. In some embodiments, the load lock chamber is provided with no transport robot.

In some embodiments, the wafer-processing apparatus further comprises (vii) a transport zone with an atmospheric transport robot for loading or unloading wafers to or from the load lock chamber, said transport zone being connected to the load lock chamber. In some embodiments, the wafer-processing apparatus further comprises (viii) multiple loading ports for storing processed or unprocessed wafers, said multiple loading ports being connected to the transport zone.

In some embodiments, the reactors are plasma enhanced CVD reactors.

In another aspect, an embodiment of the present invention provides a wafer-processing apparatus, comprising: (a) multiple discrete units of reactors disposed on the same plane, each unit having two reactors arranged (e.g., side by side) with their fronts aligned in a line; (b) a wafer-handling chamber including two wafer-handling robot arms, each having at least two end-effectors accessible to the two reactors of each unit simultaneously, said wafer-handling chamber having a polygonal shape having multiple sides corresponding to and being attached to the multiple discrete units, respectively, and one additional side for a load lock chamber, all the sides being disposed on the same plane; (c) a load lock chamber for loading or unloading two wafers simultaneously, said load lock chamber being attached to the one additional side of the wafer-handling chamber, wherein each wafer-handling robot arm is accessible to the load lock chamber; (d) multiple discrete gas boxes for controlling gases corresponding to and being connected to the multiple discrete units, respectively, said multiple discrete gas boxes being disposed under the corresponding multiple discrete units; and (e) multiple discrete electric boxes for controlling electric systems corresponding to and being detachably connected to the multiple discrete units, respectively, said multiple discrete electric boxes being disposed under the corresponding multiple discrete units and next to the corresponding multiple discrete gas boxes, wherein the gas boxes and the electric boxes are arranged alternately as viewed from above, and the electric boxes can be pulled out outwardly without being disconnected from the corresponding units so that sides of the gas boxes are accessible.

In some embodiments, in the wafer-handling chamber with the discrete units, an imaginary isosceles triangle is formed as viewed from above using sides of the adjacent units as the two equal sides of the isosceles triangle, wherein the length of the bottom of the isosceles triangle is equal to or greater than the length of the two equal sides of the isosceles triangle.

In some embodiments, the electric boxes have casters at their bottoms. In some embodiments, the wafer-handling robot arm is a multi-axis robot arm. In some embodiments, the load lock chamber is provided with no transport robot.

In some embodiments, the gas boxes and the electric boxes have an approximately trapezoidal shape having an inner face and an outer face as viewed from above wherein the inner face is shorter than the outer face as viewed from above. In some embodiments, side faces of the gas boxes and side faces of the electric boxes are closely disposed or are in contact with each other.

In some embodiments, the wafer-processing apparatus further comprises (f) a transport zone with an atmospheric transport robot for loading or unloading wafers to or from the load lock chamber, said transport zone being connected to the load lock chamber. In some embodiments, the wafer-processing apparatus further comprises (g) multiple loading ports for storing processed or unprocessed wafers, said multiple loading ports being connected to the transport zone.

In some embodiments, the reactors are plasma enhanced CVD reactors.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIGS. 8A and 8B are schematic perspective views of a plasma CVD apparatus including gas boxes and electric boxes according to an embodiment of the present invention. FIG. 8A illustrates a normal condition, and FIG. 8B illustrates a condition where an electric box is pulled out.

DETAILED DESCRIPTION OF EMBODIMENTS

In this disclosure, "gas" may include vaporized solid and/or liquid and may be constituted by a mixture of gases. In this disclosure, the reactive gas, the additive gas, and the hydrogen-containing silicon precursor may be different from each other or mutually exclusive in terms of gas types, i.e., there is no overlap of gas types among these categories. Gases can be supplied in sequence with or without overlap.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

In the present disclosure where conditions and/or structures are not specified, the skilled artisan in the art can readily provide such conditions and/or structures, in view of the present disclosure, as a matter of routine experimentation. Also, in the present disclosure including the examples described later, the numbers applied in specific embodiments can be modified by a range of at least ±50% in some embodiments, and the ranges applied in some embodiments may include or exclude the lower and/or upper endpoints. Further, the numbers include approximate numbers, and may refer to average, median, representative, majority, etc. in some embodiments.

In all of the disclosed embodiments, any element used in an embodiment can interchangeably or additionally be used in another embodiment unless such a replacement is not feasible or causes adverse effect or does not work for its intended purposes. Further, the present invention can equally be applied to apparatuses and methods.

In the disclosure, "substantially smaller", "substantially different", "substantially less" or the like may refer to a difference recognized by a skilled artisan such as those of at least 1%, 5%, 10%, 20%, 30%, 40%, 50%, 60%, 70%, 80%, or any ranges thereof in some embodiments. Also, in the disclosure, "substantially the same", "substantially uniform", or the like may refer to a difference recognized by a skilled artisan such as those of less than 10%, less than 5%, less than 1%, or any ranges thereof in some embodiments.

In this disclosure, any defined meanings do not necessarily exclude ordinary and customary meanings in some embodiments.

The disclosed embodiments will be explained with respect to the drawings. However, the present invention is not limited to the disclosed embodiments or the drawings.

Figure 1:
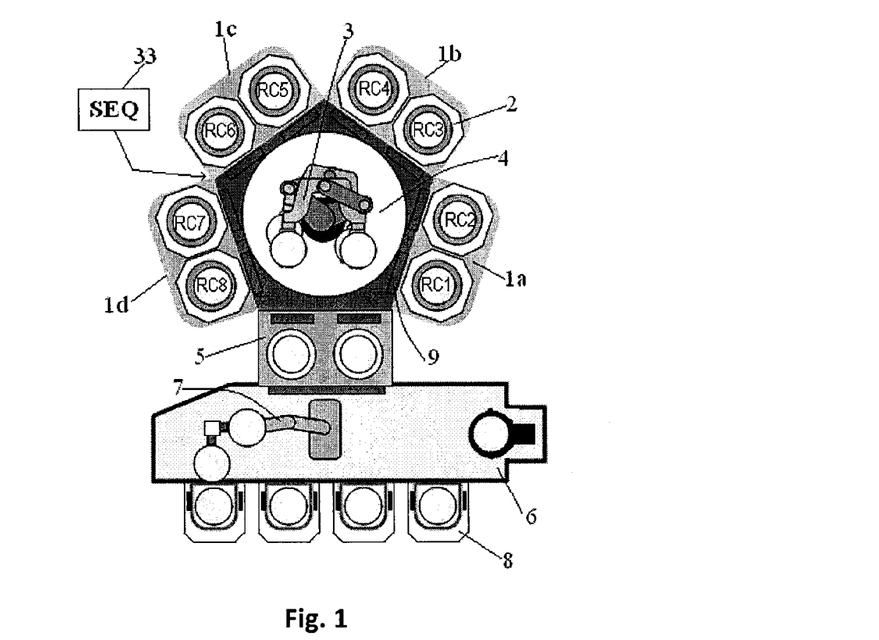
FIG. 1 is a schematic plan view of a plasma CVD apparatus according to an embodiment of the present invention.

FIG. 1 is a schematic plan view of a wafer-processing apparatus combining four process modules 1a, 1b, 1c, 1d (each provided with two reactors 2), a wafer in/out chamber 5, and a wafer-handling chamber 4 provided with back end robot arms 3, desirably in conjunction with controls programmed to conduct the sequences described below, which can be used in some embodiments of the present invention. In this embodiment, the wafer-processing apparatus comprises: (i) eight reactors 2 (RC1 to RC8) for processing wafers on the same plane, constituting four discrete process modules (units) 1a, 1b, 1c, 1d, each module 1 having two reactors 2 arranged side by side with their fronts aligned in a line; (ii) a wafer-handling chamber 4 including two back end robot arms 3 (wafer-handling robot arms), each having at least two end-effectors accessible to the two reactors of each unit simultaneously, said wafer-handling chamber 4 having a polygonal shape having four sides corresponding to and being attached to the four process modules 1a, 1b, 1c, 1d, respectively, and one additional side for a wafer in/out chamber (load lock chamber) 5, all the sides being disposed on the same plane; and (iii) a wafer in/out chamber 5 for loading or unloading two wafers simultaneously, said wafer in/out chamber 5 being attached to the one additional side of the wafer-handling chamber, wherein each back end robot arm 3 is accessible to the wafer in/out chamber 5. The interior of each reactor 2 and the interior of the wafer in/out chamber 5 can be isolated from the interior of the wafer handling chamber 4 by a gate valve 9.

Figure 2:
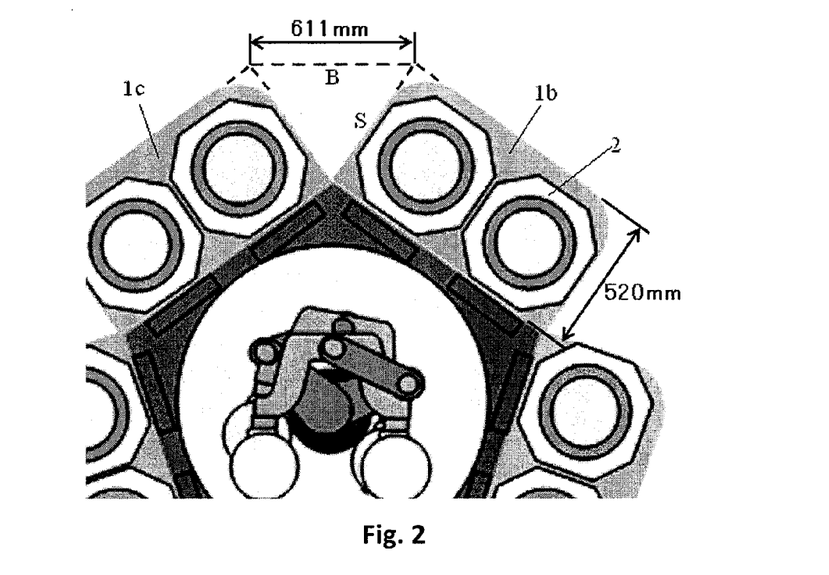
FIG. 2 is an enlarged partial view of the plasma CVD apparatus according to an embodiment of the present invention.

In this embodiment, as shown in FIG. 2, an imaginary isosceles triangle can be formed as viewed from above using sides of the adjacent modules (e.g., 1b and 1c) as the two equal sides (S) of the isosceles triangle, wherein the length of the bottom (B) of the isosceles triangle is equal to or greater than the length of the two equal sides (S) of the isosceles triangle. Due to the above configuration, maintenance can easily be performed using the space defined by the isosceles triangle. For example, the interior of each reactor is accessible from its bottom from two sides (front and side). In an embodiment, S is about 520 mm, and B is about 611 mm. Preferably, B is about 600 mm or greater.

Since eight reactors are arranged in four modules attached to the wafer-handling chamber, if a handling time defined as a time period required for unloading/loading wafers from/to a module and becoming ready for unloading/loading wafers from/to a next module is about one third of a process time defined as a time period required for processing wafers in a module, productivity or throughput becomes maximum or optimal. For example, if the handling time is about 20 seconds and the process time is about 60 seconds, unloading processed wafers and loading unprocessed wafers can be complete for the second, third, and fourth modules while processing the wafers in the first module. This sequence is performed by a sequencer 10 in FIGS. 1 and 3 and is illustrated in FIG. 5. When four modules are connected to the wafer-handling chamber, if the ratio of handling time to process time is about ⅓, there is substantially no dead time; i.e., the back end robot arms and the reactors are substantially continuously in operation, and there is substantially no waiting time for the back end robot arms or the reactors. However, when four modules are connected to the wafer-handling chamber, if the ratio of handling time to process time is about ¼, there is dead time, i.e., the back end robot arms wait for the first module to finish processing the wafers, although the back end robot arms finish unloading/loading wafers from/to the fourth module and are ready to unload the processed wafers from the first module. In some embodiments, the apparatus can process about 400 wafers per hour (in some embodiments, about 200 to about 800 wafers can be processed per hour).

Figure 4:
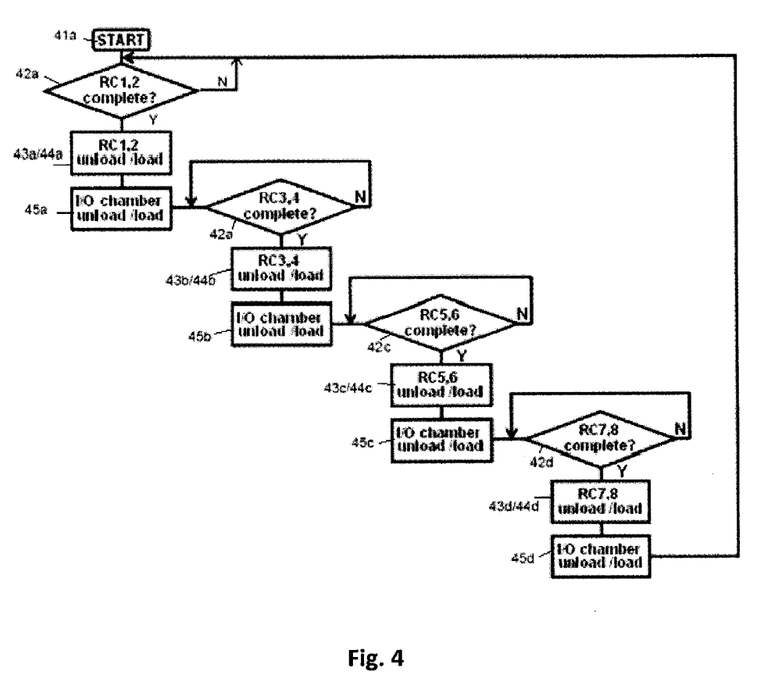
FIG. 4 is a flowchart showing process sequences according to an embodiment of the present invention.

In this embodiment, a sequencer performs the above sequences, using the back end robot arms, i.e., steps of unloading/loading processed/unprocessed wafers from/to one of the units, and steps of unloading/loading processed/unprocessed wafers from/to all the other units in sequence while the wafers are in the one of the units, preferably while processing the wafers in the one of the units. FIG. 4 is a flowchart showing process sequences performed by the sequencer according to some embodiments of the present invention. The sequencer starts (step 41a) and performs the following sequences: When the first module (RC1, 2) finishes processing wafers (step 42a), the processed wafers are unloaded from the first module (RC1, 2) by the back end robot arm (RB1) (step 43a). The back end robot arm (RB2), which has loaded unprocessed wafers, then loads the unprocessed wafers to the first module (RC1, 2) (step 44a). The back end robot arm (RB1) and the back end robot arm (RB2) then move together toward the wafer in/out chamber, the back end robot arm (RB1) unloads the processed wafers to the wafer in/out chamber, and the back end robot arm (RB2) loads unprocessed wafers from the wafer in/out chamber (step 45a). The time period required for unloading the processed wafers and for loading the unprocessed wafers constitutes a handling time. Next, when the second module (RC3, 4) finishes processing wafers (step 42b), the processed wafers are unloaded from the second module (RC3, 4) by the back end robot arm (RB2) (step 43b). The back end robot arm (RB1), which has loaded unprocessed wafers, then loads the unprocessed wafers to the second module (RC3, 4) (step 44b). The back end robot arm (RB2) and the back end robot arm (RB1) then move together toward the wafer in/out chamber, the back end robot arm (RB2) unloads the processed wafers to the wafer in/out chamber, and the back end robot arm (RB1) loads unprocessed wafers from the wafer in/out chamber (step 45b). Next, in the same manner, the back end robot arm (RB1) unloads processed wafers from the third module (RC5, 6) and the back end robot arm (RB2) loads unprocessed wafers to the third module (RC5, 6) in step 42c (corresponding to step 42a), step 43c (corresponding to step 43a), step 44c (corresponding to step 44a), and step 45c (corresponding to step 45a). Next, in the same manner, the back end robot arm (RB2) unloads processed wafers from the fourth module (RC7, 8) and the back end robot arm (RB1) loads unprocessed wafers to the fourth module (RC7, 8) in step 42d (corresponding to step 42b), step 43d (corresponding to step 43b), step 44d (corresponding to step 44b), and step 45d (corresponding to step 45b). The above sequences are repeated a desired number of times.

In some embodiments, each of two back end robot arms has four end effectors (upper and lower end effectors on each of right and left sides), wherein unloading and loading wafers from and to the same module can be accomplished continuously by one back end robot arm, while another back end robot arm unloads and loads wafers at the wafer in/out chamber. In such embodiments, reactors have buffer mechanisms to cooperate with dual end effectors. In some embodiments, the wafer transport robot arm having upper and lower end effectors and the transfer mechanisms disclosed in U.S. Pat. No. 7,690,881 can be employed, the disclosure of which is herein incorporated by reference in its entirety.

A skilled artisan will appreciate that the apparatus includes one or more controller(s) including the sequencer (not shown in FIG. 1) programmed or otherwise configured to cause the deposition and reactor cleaning processes described elsewhere herein to be conducted. The controller(s) will be communicated with the various power sources, heating systems, pumps, robotics and gas flow controllers or valves of the reactor, as will be appreciated by the skilled artisan.

Figure 3:
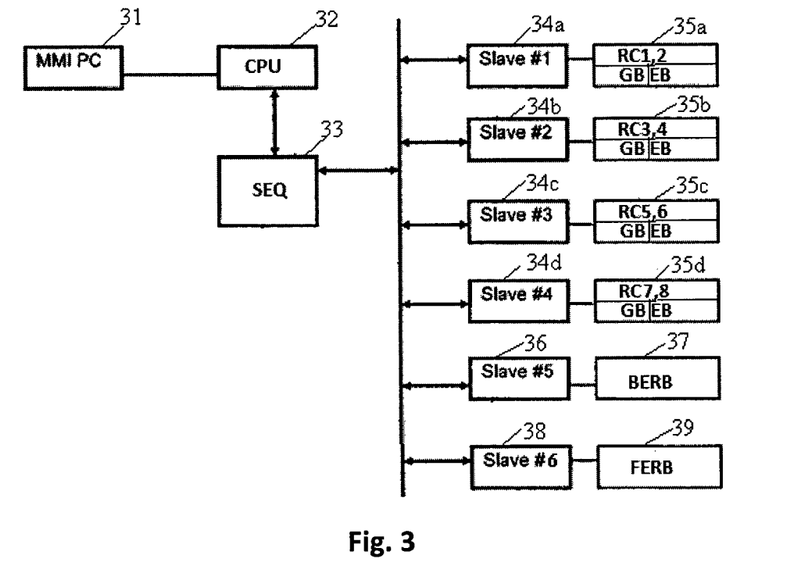
FIG. 3 is a schematic diagram showing a control system of a semiconductor substrate processing apparatus and a substrate transfer apparatus according to an embodiment of the present invention.

FIG. 3 is a schematic diagram showing a control system of a wafer-processing apparatus according to some embodiments of the present invention. Setting of system recipes, process recipes, etc. can be performed through MMI PC (Man Machine Interface, PC for display) 31. Information from MMI PC 31 is sent to a CPU board (CPU) 32 for communication with MMI PC, and is then inputted into a sequencer (SEQ) 33 as a main controller. The SEQ 33 instructs slave boards 34a to 38 to execute recipes (e.g., process recipes) according to the system recipe. In this embodiment, Slave #1 (34a) controls the first module (RC1, 2) 35a; Slave #2 (34b) controls the second module (RC3, 4) 35b; Slave #3 (34c) controls the third module (RC5, 6) 35c; Slave #4 (34d) controls the fourth module (RC7, 8) 35d, Slave #5 (36) controls the back end robot (BERB) 37 (vacuum robot); and Slave #6 controls the front end robot (FERB) 39 (atmospheric robot). In some embodiments, the reaction chambers in each module are discrete and separated from each other, i.e., the interiors of the reaction chambers are not gas-communicated with each other. In some embodiments, the reaction chambers share a common atmosphere or at least a portion of gases.

In some embodiments, each module has a single discrete gas box (GB) and a single discrete electric box (EB) as shown in FIG. 3. In some embodiments, the modules share a common gas box and a common electric box.

In some embodiments, the sequencer stores software programmed to execute the flowchart and sequences shown in FIGS. 4 and 5, for example. The sequencer also checks the status of each reaction chamber, positions wafers in each reaction chamber using sensing systems, controls each gas box (GB) and each electric box (EB) for each module, controls a front end robot (FERB) 7 in an equipment front end module (EFEM) 6 based on a distribution status of wafers stored in loading ports (LP) 8 and a load lock chamber (LLC) 5, controls back end robot arms (BERB) 3, and controls gate valves (GV) 9 as shown in FIG. 1.

Figure 6:
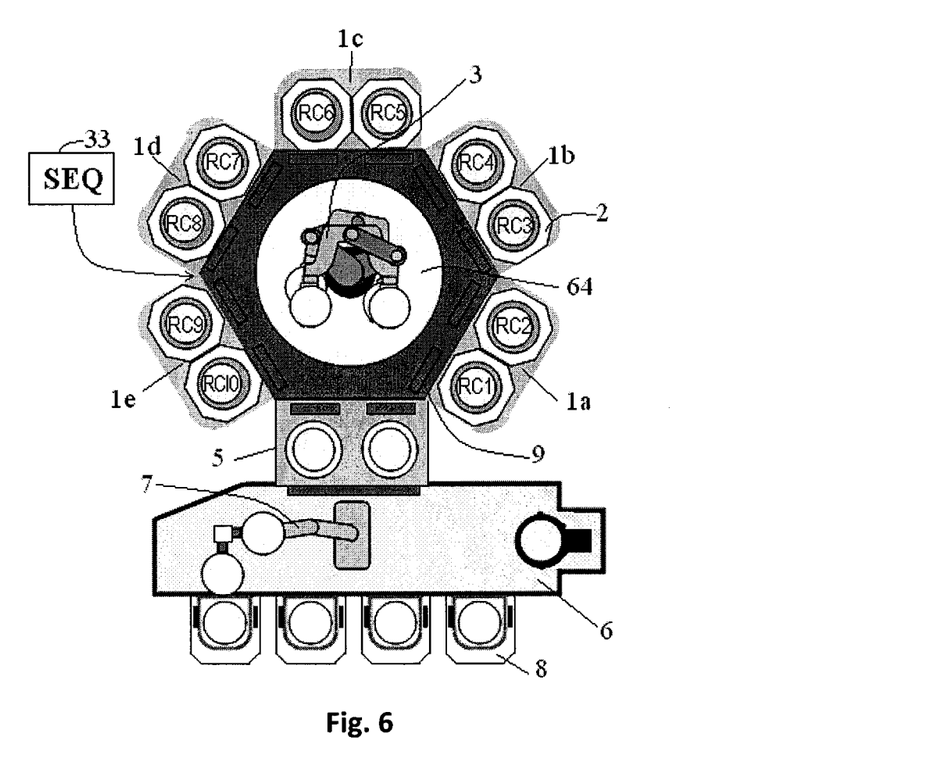
FIG. 6 is a schematic view of a plasma CVD apparatus according to another embodiment of the present invention.

In some embodiments, the apparatus has 10 reactors in five modules as shown in FIG. 6. A module 1e (RC9, 10) is added to the configuration of the apparatus illustrated in FIG. 1, and in order to accommodate the additional module, a wafer-handling chamber 64 has five sides corresponding to and being attached to the five discrete modules 1a, 1b, 1c, 1d, respectively, and one additional side for a load lock chamber 5. The apparatus illustrated in FIG. 6 has the same functions and configurations as those described for the apparatus illustrated in FIG. 1 except for those related to the additional module 1e. In some embodiments, the wafer-handling chamber has a shape of a regular hexagon as viewed from above, as opposed to the shape of a regular pentagon as shown in FIG. 1. In some embodiments, the additional side for the load lock chamber can be longer or shorter than the side for each module.

In some embodiments where five modules are used, an imaginary isosceles triangle can be formed as viewed from above using sides of the adjacent modules as the two equal sides (S) of the isosceles triangle, wherein the length of the bottom (B) of the isosceles triangle is equal to or greater than the length of the two equal sides (S) of the isosceles triangle, as described in relation to the embodiment of using four modules in FIG. 2. Due to the above configuration, maintenance can easily be performed using the space defined by the isosceles triangle. For example, the interior of each reactor is accessible from its bottom from two sides (front and side). In an embodiment, S is about 520 mm, and B is about 520 mm.

The sequence when using five modules is illustrated in FIG. 5. When five modules are connected to the wafer-handling chamber, if the ratio of handling time to process time is about ¼, there is substantially no dead time; i.e., the back end robot arms and the reactors are substantially continuously in operation, and there is substantially no waiting time for the back end robot arms or the reactors. However, when five modules are connected to the wafer-handling chamber, if the ratio of handling time to process time is about ⅓, there is dead time, i.e., the processed wafers in the first module wait for the back end robot arms to finish unloading/loading wafers from/to the fifth module, although the first module has finished processing the wafers and is ready to unload the processed wafers therefrom. The flowchart used for the sequence is substantially similar to that shown in FIG. 4.

In some embodiments, the wafer-handling chamber can accommodate more than five modules. The sequence when using six modules is illustrated in FIG. 5. When six modules are connected to the wafer-handling chamber, if the ratio of handling time to process time is either about ⅓ or about ¼, there is dead time, i.e., the processed wafers in the first/second module wait for the back end robot arms to finish unloading/ loading wafers from/to the fifth/sixth module, although the first/second module has finished processing the wafers and is ready to unload the processed wafers therefrom. However, if the ratio of handling time to process time is about ⅕, there is no dead time, optimizing the productivity or throughput. However, a gap between the adjacent modules is likely (although not necessarily) to become insufficient to conduct maintenance of the modules, i.e., the length of the bottom of an isosceles triangle is shorter than the length of the two equal sides of the isosceles triangle.

Figure 7:
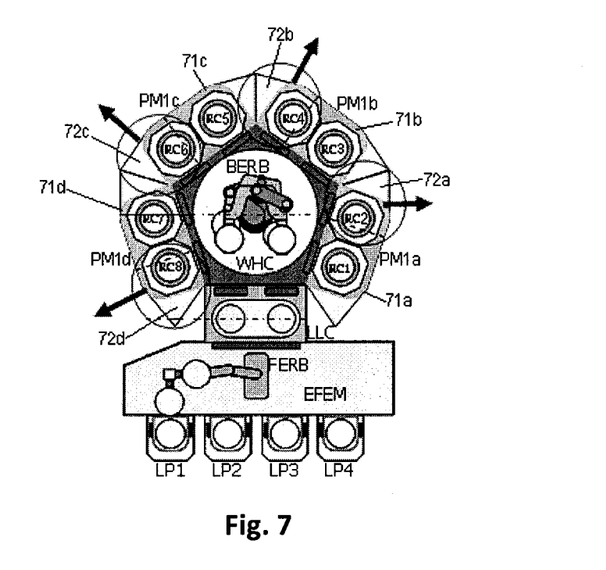
FIG. 7 is a schematic plan view of a plasma CVD apparatus including gas boxes and electric boxes according to an embodiment of the present invention.
Figure 8A:
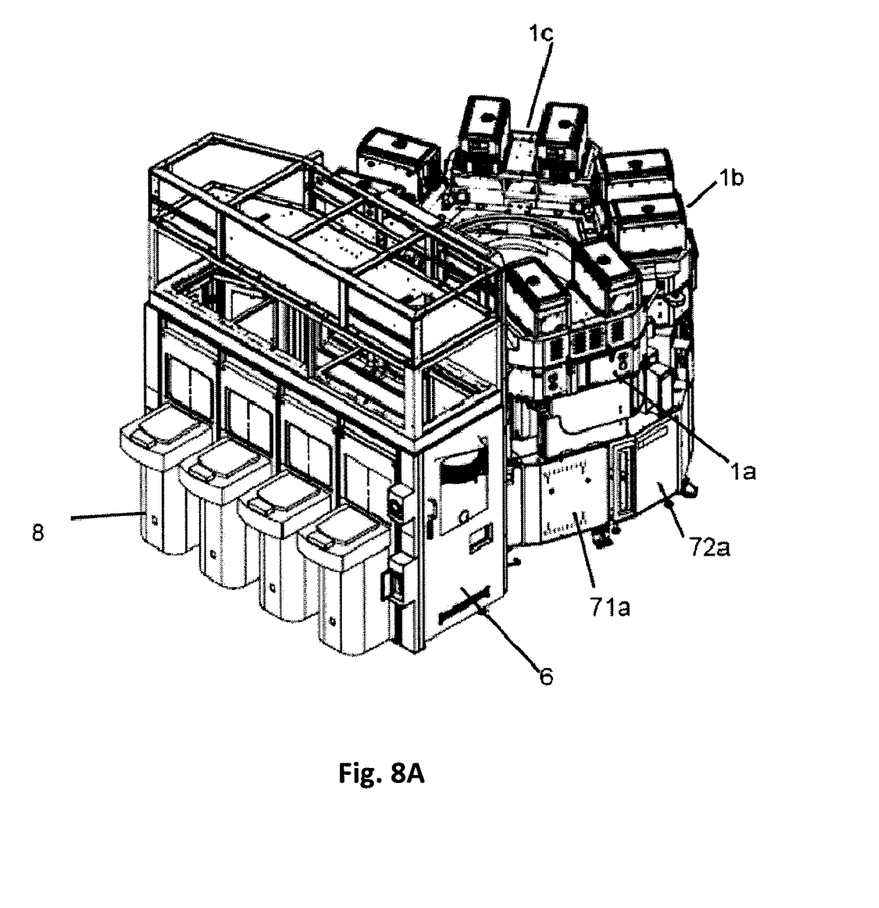
Figure 8B:
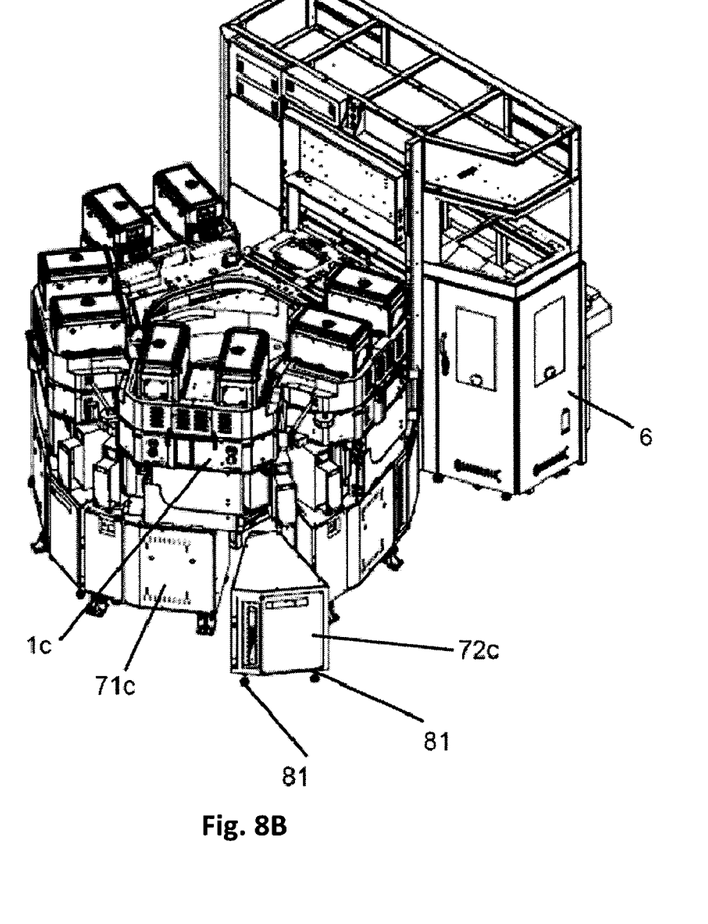
Figure 9:
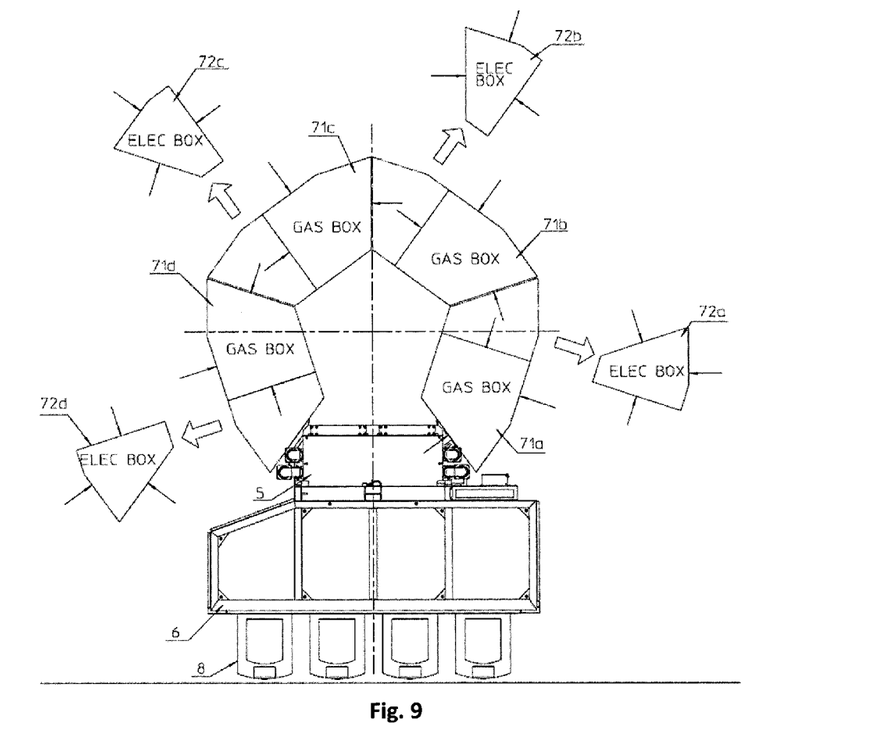
FIG. 9 is a schematic plan view of a plasma CVD apparatus according to an embodiment of the present invention wherein the electric boxes are pulled out.

In some embodiments, in order to facilitate maintenance operation, multiple discrete gas boxes are provided for controlling gases corresponding to and being connected to the multiple discrete modules, respectively, wherein the multiple discrete gas boxes are disposed under the corresponding multiple discrete modules. In some embodiments, also, multiple discrete electric boxes are provided for controlling electric systems corresponding to and being detachably connected to the multiple discrete modules, respectively, wherein the multiple discrete electric boxes are disposed under the corresponding multiple discrete modules and next to the corresponding multiple discrete gas boxes. As illustrated in FIGS. 7, 8A, and 8B, in some embodiments, gas boxes 71a, 71b, 71c, 71d and electric boxes 72a, 72b, 72c, 72d are arranged alternately as viewed from above, corresponding to and underneath process modules (PM) 1a, 1b, 1c, 1d, respectively. The electric boxes 72a, 72b, 72c, 72d can be pulled out outwardly without being disconnected from the corresponding modules so that sides of the gas boxes are accessible. In some embodiments, the electric boxes have casters 81 at their bottoms so that they can easily be pulled out for maintenance. FIG. 8B shows the gas box 71c and the electric box 72c disposed under the module 1c, wherein the electric box 72c is pulled out using the casters 81. In some embodiments, as shown in FIGS. 7, 8A, and 8B, the gas boxes and the electric boxes have an approximately trapezoidal shape having an inner face and an outer face as viewed from above wherein the inner face is shorter than the outer face as viewed from above. The "approximately trapezoidal shape" includes a polygonal shape having more than four sides such as a pentagon wherein the greatest interior angle of the polygonal shape is substantially or nearly close to 180° (as illustrated in FIG. 9), or a trapezoidal shape having at least one curved side. Also as shown in FIGS. 7, 8A and 8B, in some embodiments, the side faces of the gas boxes and side faces of the electric boxes are closely disposed or are in contact with each other, so that the width of the apparatus can be reduced. In some embodiments, even if the apparatus has eight rectors (four modules), its width is smaller than that of a conventional apparatus having six reactors (three modules).

FIG. 9 shows configurations after the electric boxes 72a, 72b, 72c, 72d are pulled out. In order to maintain connection to the modules, the electric boxes include long and/or highly flexible cables and/or wiring harnesses (not shown) which are so extendable that the electric boxes can be pulled out without disconnecting from the modules. The arrows show accessible directions for maintenance. After the electric boxes are pulled out, each gas box 71a, 71b, 71c, 71d and each electric box 72a, 72b, 72c, 72d are accessible from three side faces by removing panels therefrom. Further, by utilizing the spaces created by pulling out the electric boxes and the gaps between the modules, maintenance of the modules and the wafer-handling chamber (including the gate valves, etc.) can easily be performed by accessing them through the bottoms of the modules which are exposed after the electric boxes are pulled out.

In some embodiments, the gas box includes devices for gas flow control such as mass flow controllers (MFC) and baking units for liquid precursors, which control flow of reactive gas, additive gas such as oxidizing gas and inert gas, and precursor gas such as silicon precursor. In some embodiments, the electric box includes devices for electrically controlling the systems such as flexible cables, wiring harnesses, CPU boards, temperature controllers, circuit protectors, power supplies, relays, and the like, and at least substantial parts of the above are included in the electric box.

In some embodiments, the reactors of the modules can be any suitable reactors for processing or treating wafers, including plasma enhanced CVD reactors, thermal CVD reactors, plasma enhanced ALD reactors, thermal ALD reactors, etching reactors, UV-curing reactors. Typically, the reactors are plasma CVD reactors for depositing a thin film or layer on a wafer. In some embodiments, all the modules are of the same type having identical capability for treating wafers so that the unloading/loading can sequentially and regularly be timed, thereby increasing productivity or throughput. In some embodiments, the modules have different capacities (e.g., different treatments) but their handling times are substantially identical.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A wafer-processing apparatus, comprising:
   eight or ten reactors with identical capacity for processing wafers on the same plane, constituting four or five discrete units, each unit consisting of two reactors arranged with their fronts aligned in a line, each reactor being a single-wafer processing reactor;
   a wafer-handling chamber including two wafer-handling robot arms, each having at least two end-effectors accessible to the two reactors of each unit simultaneously, said wafer-handling chamber having a polygonal shape having four or five sides corresponding to and being attached to the four or five discrete units, respectively, and one additional side for a load lock chamber, all the sides being disposed on the same plane;
   a load lock chamber for loading or unloading two wafers simultaneously, said load lock chamber being attached to the one additional side of the wafer-handling chamber, wherein each wafer-handling robot arm is accessible to the load lock chamber; and
   a sequencer programmed to perform, using the two wafer-handling robot arms wherein one arm is loaded with unprocessed wafers and the other arm is unloaded,
     a step of unloading processed wafers from one of the units to the other arm and then continuously loading unprocessed wafers to the one of the units from the one arm which then becomes an unloaded arm, wherein the processed wafers are unloaded from the other arm to the load lock chamber and unprocessed wafers are loaded from the load lock chamber to the other arm which then becomes a loaded arm, and
     a step of processing the wafers in each unit, wherein a ratio of a duration of the unloading and loading step for each unit, which duration is constant for all of the units, to a duration of the step of processing the wafers in each unit, which duration is constant for all of the units, is set at about ⅓ for the four discrete units or at about ¼ for the five discrete units so as to continuously repeat the unloading and loading step in all of the units in preset sequence, involving substantially no waiting time between the unloading and loading step and the processing step in each unit and substantially no full overlap time when all of the units are simultaneously in the processing step, thereby completing one cycle when the unloading and loading step is performed in all of the units, and to continuously repeat the cycle.

2. The wafer-processing apparatus according to claim 1, further comprising:
   four or five discrete gas boxes for controlling gases corresponding to and being connected to the four or five discrete units, respectively, said four or five discrete gas boxes being disposed under the corresponding four or five discrete units; and
   four or five discrete electric boxes for controlling electric systems corresponding to and being detachably connected to the four or five discrete units, respectively, said four or five discrete electric boxes being disposed under the corresponding four or five discrete units and next to the corresponding four or five discrete gas boxes, wherein the gas boxes and the electric boxes are arranged alternately as viewed from above, and the electric boxes can be pulled out outwardly without being disconnected from the corresponding units so that three sides of the gas boxes are accessible.

3. The wafer-processing apparatus according to claim 2, wherein the electric boxes have casters at their bottoms.

4. The wafer-processing apparatus according to claim 2, wherein the gas boxes and the electric boxes have an approximately trapezoidal shape having an inner face and an outer face as viewed from above wherein the inner face is shorter than the outer face as viewed from above.

5. The wafer-processing apparatus according to claim 4, wherein side faces of the gas boxes and side faces of the electric boxes are closely disposed or are in contact with each other.

6. The wafer-processing apparatus according to claim 1, wherein the polygonal shape is a pentagon or hexagon.

7. The wafer-processing apparatus according to claim 1, wherein each wafer-handling robot arm is a multi-axis robot arm.

8. The wafer-processing apparatus according to claim 1, further comprising a transport zone with an atmospheric transport robot for loading or unloading wafers to or from the load lock chamber, said transport zone being connected to the load lock chamber.

9. The wafer-processing apparatus according to claim 8, further comprising multiple loading ports for storing processed or unprocessed wafers, said multiple loading ports being connected to the transport zone.

10. The wafer-processing apparatus according to claim 1, wherein the reactors are plasma enhanced CVD reactors.

* * * * *